US006548175B2

(12) United States Patent
Sachdev et al.

(10) Patent No.: US 6,548,175 B2
(45) Date of Patent: Apr. 15, 2003

(54) EPOXY-SILOXANES BASED ELECTRICALLY CONDUCTIVE ADHESIVES FOR SEMICONDUCTOR ASSEMBLY AND PROCESS FOR USE THEREOF

(75) Inventors: Krishna G. Sachdev, Hopewell Junction, NY (US); Raymond A. Jackson, Fishkill, NY (US); Amy B. Ostrander, Wappingers Falls, NY (US); Charles H. Perry, Poughkeepsie, NY (US); Megan J. Shannon, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 09/759,012

(22) Filed: Jan. 11, 2001

(65) Prior Publication Data

US 2002/0127406 A1 Sep. 12, 2002

(51) Int. Cl.$^7$ .......................... B32B 27/38; C09J 11/00; C08L 63/00
(52) U.S. Cl. ....................... 428/414; 428/413; 428/447; 428/448; 427/386; 427/387; 427/96; 156/329; 156/330; 523/400; 524/439; 528/12; 528/14; 528/15; 528/33; 528/40; 525/107
(58) Field of Search ................................ 428/413, 414, 428/418, 447, 448, 450; 427/387, 386, 96; 156/292, 326, 329, 330; 524/265, 439; 528/12, 14, 15, 33, 40; 523/400; 525/107

(56) References Cited

U.S. PATENT DOCUMENTS

| 5,182,623 | A | | 1/1993 | Hynecek |
| 5,528,466 | A | | 6/1996 | Lim et al. |
| 5,699,228 | A | | 12/1997 | Lee |
| 5,700,581 | A | * | 12/1997 | Sachdev et al. ............ 428/447 |

* cited by examiner

Primary Examiner—Margaret G. Moore
Assistant Examiner—Michael J Feely
(74) Attorney, Agent, or Firm—DeLio & Peterson, LLC; John J. Tomaszewski; James J. Cioffi

(57) ABSTRACT

The invention is directed to improved conductive adhesives for solder-free interconnections in microelectronic assembly processes such as for chip carrier-to-substrate attachment. These adhesives are characterized by low tensile modulus, low resistivity, high adhesion strength, and durability of these properties during reliability stress conditions of thermal shock, thermal aging, and temperature/humidity (85° C./85%) exposure of the assembled devices. The adhesives contain a homogeneous solution of a siloxane containing epoxide, a curing agent, a curing catalyst and an organic polymeric or oligomeric additive. A conductive filler is added to the solution forming the filler. Preferred fillers are Ag coated with Pd and Ag coated with Au.

15 Claims, No Drawings

EPOXY-SILOXANES BASED ELECTRICALLY CONDUCTIVE ADHESIVES FOR SEMICONDUCTOR ASSEMBLY AND PROCESS FOR USE THEREOF

BACKGROUND OF THE INVENTION

1. Field of the Invention

The invention is directed to improved conductive adhesives for solder-free interconnections in microelectronic assembly processes for attachment of electronic components to a substrate and, in particular, for chip carrier-to-substrate interconnections. These adhesives are characterized by low tensile modulus, low resistivity, high adhesion strength, and durability of these properties during reliability stress conditions of thermal shock, thermal aging, and temperature/humidity (85° C./85%RH) exposure of the assembled devices.

2. Description of Related Art

Improved conductive adhesives are required for Pb solder-free interconnection solution as lead/tin (Pb/Sn) alternatives in the fabrication of electronic packaging structures as for single chip and multi-chip electronic modules, typically used in high speed computers, automotive electronics, medical and telecommunication devices, cellular phones, and other consumer products. For reliable product performance with conductive adhesives as interconnecting materials for attaching a ceramic chip carrier or surface mount components as electrical resistor or capacitor, to flexible or rigid printed circuit boards (PCB), it is important for a conductive adhesive as the bonding material to have the requisite properties to withstand and absorb the thermal coefficient of expansion (TCE) mismatch induced material stresses between dissimilar contacting materials. For example, in the case of ball grid array packages (BGA) with ceramic chip carrier-to-board connections where the organic board which is typically the epoxy-glass organic board, FR-4, and the bismaleimide triazine (BT) resin based material has a TCE about 20–35 ppm/°, and that of a ceramic chip carrier 3–7 ppm/°, the metal filled organic conductive adhesive as the interconnecting material must be capable of maintaining bond integrity to assure performance reliability of the electronic module during reliability assessment stress exposures involving thermal shock and 85° C./85%RH temperature-humidity excursions and in long term operation. Some of the desirable properties of the organic based conductive adhesives for Pb-free interconnections to provide the benefit of Pb elimination in electronic devices include: low stress, low tensile modulus, low resistivity, stable joint resistance with temperature and T/H exposure, high bond strength, void-free bonding, and bond integrity during environmental stress conditions.

The commonly available thermosetting conductive epoxies which are typically derived from glycidoxy ethers of bis-phenol A and bis-phenol F epoxy resins are generally high modulus materials and thus present a concern about the long term functional reliability of the product when these adhesives are used for bonding dissimilar materials with significant TCE differential, for example, ceramic chip carrier to organic printed circuit board (PCB). Also, most of the commercially available formulations of isotropic conductive adhesives are Ag-filled where the issue of silver migration during temperature-humidity exposure is one of the concerns in their use as interconnection materials in place of Pb/Sn solder. The available flexible epoxies are not satisfactory due to the low thermal stability, performance variability, and in some cases have too short a pot life for practical use in a manufacturing environment. Available electrically conductive thermoplastic polymer based compositions are generally solvent-based which have the problem of dispersion stability, resin bleed, voids in the bond line, and performance variability. Electrically conductive silicone elastomeric compositions are yet another class of conductive adhesives for a variety of applications including Pb-free interconnections, elastomeric connectors in electronic module assembly, EMI shielding and heat sink attachment. Although these materials have the compliance and stress absorbing property to qualify for interconnections between materials with significant difference in TCE, these have been found to have limitations in terms of adhesion to Au and other relevant surfaces, problem of bond failure and resistance increase when the assembled structures are exposed to T/H environment.

U.S. Pat. No. 5,699,228 (Alkov et al.), is concerned with a method of interconnecting a leadless multichip module to a printed wiring board using solder-free interconnects to form the electronic module. U.S. Pat. No. 5,528,466 (Lim et al.) is concerned with mounting and cooling a plurality of integrated circuits using elastomeric connectors and a plurality of electrical components having terminals onto a PCB surface. U.S. Pat. No. 5,182,623 (Hynecek) is concerned with an interconnect structure and heat sink.

U.S. Pat. No. 5,700,581, assigned to the assignee of the present invention, is concerned with solvent-free epoxy-siloxane based adhesives for attachment of silicon device chip to ceramic substrate in the fabrication of single chip (SCM) and multichip (MCM) electronic modules. The conductive adhesives described in this patent comprise a siloxane precursor in conjunction with anhydride or hydroxy benzophenones as curing agents, cure catalyst/cure accelerator, and silver flake as the conductive filler. These adhesives are described as having high die shear strength which is maintained when the adhesive bonded chip-substrate assembly is exposed to thermal shock involving −65° C. to about +150° C. thermal excursions, and temperature-humidity cycling (85° C./85%RH). In the case of silicon chip (TCE about 3 ppm) attachment to ceramic substrate (TCE about 3–7 ppm) application, the conductive adhesives are not exposed to thermal expansion mismatch stresses which would occur with the bonded materials that have significantly different TCE. For example, in the case of the bonding of a ceramic chip carrier (TCE 3–7 ppm) to an organic board (TCE 20–35 ppm), there is significant mismatch in the thermal expansion of the two materials and therefore, there is a need for improved conductive adhesives that would have the necessary performance characteristics for interconnection reliability in applications involving TCE mismatched bonded materials. Also, based on the concerns about silver migration with silver filled conductive adhesives commonly described in the prior art and the ones described in U.S. Pat. No. 5,700,581, there exists a need for improvement in the electrically conductive adhesives as alternative interconnections which do not present the problem of metal migration when the assembled device is subjected to reliability stress conditions and to temperature-humidity environment during normal operation.

The present invention addresses the need for improvements in conductive adhesives, especially the necessary requirement for compliant interconnections for absorption of stresses generated when there is significant TCE mismatch between the bonded materials, and the issue of silver migration with silver filled adhesives. The invention provides isotropically conductive adhesives which have low modulus and thus are capable of absorbing thermal stresses with TCE mismatched bonded materials, which have low resistivity and undergo no significant change in resistivity with thermal cycling and temperature-humidity excursions, which maintain high adhesion strength with Au and ceramic, and which employ Au or Pd surface coated Ag as the preferred filler instead of the commonly used Ag flake, and which provide stable performance during reliability stress exposure and assures performance durability in long term operation of assembled devices.

Bearing in mind the problems and deficiencies of the prior art, it is therefore an object of the present invention to provide a conductive adhesive which may be used as interconnecting materials in the manufacture of electronic components, and, to attach electronic components to a substrate, and, in particular, to attach a ceramic chip carrier to a substrate or an organic board such as a printed circuit board (PCB).

It is another object of the present invention to provide a method for making electronic components by the use of a conductive adhesive to connect the components such as a silicon chip, or passive electronic components as electrical resistor or capacitor to a substrate such as a printed circuit board and to the electronic components made by the method.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to conductive adhesives as interconnecting materials for solder replacement in electronic module assembly, which adhesives are capable of providing stable and reliable performance of the electronic devices fabricated using these adhesives for interconnections, for example, between a chip carrier and a board, attachment of surface mount components (SMT) to a printed circuit board (PCB), attachment of heat sink for cooling, and for chip attachment to a chip carrier. The desirable properties of the conductive adhesives for these applications include: low resistivity; stable resistance; high adhesion strength with various contacting materials, particularly, Au, lead-tin solder (Pb/Sn), alumina ceramic, glass ceramic, and silicon; maintaining bond integrity during reliability stress exposures involving thermal cycling, thermal shock, and T/H exposure; void-free bond line; thermal stability at least up to 250° C.; paste viscosity suitable for screening or dispensing; and polymer-conductive filler dispersion stability preferably that no change in viscosity occurs for at least 8 hrs. at room temperature.

In a first aspect this invention is concerned with solvent-free isotropically conductive adhesives having improved structural and functional performance characteristics in terms of polymer chain flexibility; thermomechanical properties; resistance to cracking; adhesion to Au, lead-tin solder, and ceramic; low moisture absorption, low resistivity, and TCR stability (thermal coefficient of resistance), and other relevant properties for reliable performance as interconnect materials. These adhesives are comprised of high conductivity noble metal filler as the major component dispersed in an epoxy siloxane/preformed polymeric or oligomeric additive/anhydride curing agent/cure catalyst system as the organic carrier. The conductive adhesive formulation is preferably prepared by blending the liquid epoxy siloxane precursor with the polymeric/oligomeric additive, e.g., an alkylacrylate or methacrylate polymer, and an anhydride curing agent and in which the organic constituents are all mutually soluble to form the desired viscosity binder system. A metal filler is added to the binder system typically in the range of 75–90% (wt. %) to form a paste with a viscosity and rheology properties suitable for screening or for syringe dispensing using autodispense tools. The metal filler can be Ag, Ag/Pd, Ag/Au and mixtures thereof, which is preferably in flake form although powder form can also be used. The highly preferred metal filler according to this invention is Au or Pd surface coated Ag or it can be a blend of Ag and Pd or Ag and Au such that the Pd or Au are present up to about 5–20wt % based on the total weight of the filler in the paste. The metal filler can be further modified by using metal particles of different morphology such as powder and flake combination, particle size distribution of polydisperse powder filler to assure maximum packing density, addition of ultrafine particles as Ag, Pd, Au nanoparticles with varying size, particle size distribution, shape, and morphology.

Broadly stated, the invention provides a curable epoxy-siloxane based solvent-free conductive adhesive composition comprising:
    a siloxane containing at least two epoxy-functional groups, or mixtures thereof;
    a curing agent;
    a curing catalyst;
    an organic polymeric or oligomeric additive; and
    a conductive filler;
    wherein the siloxane, curing agent, curing catalyst and polymer additive are mutually soluble.

In another aspect the invention provides a method for making an electronic component assembly, which requires conductive attachment of separate components comprising the steps of:
    applying, for example, by screen printing or syringe dispensing, a conductive adhesive on the bonding pads on one of the components to be bonded, the conductive adhesive comprising:
        a siloxane comprising at least two epoxy-functional groups, or mixtures thereof;
        a curing agent;
        a curing catalyst;
        an organic polymeric or oligomeric additive; and
        a conductive filler;
        wherein the siloxane, curing agent, curing catalyst and polymer additive are mutually soluble;
    placing and aligning with the contact pads of the other component to be bonded on the adhesive coated pads of the first component; and
    heating or otherwise curing the assembled structure to cure the conductive adhesive to provide the desired interconnections between the components.

DESCRIPTION OF THE PREFERRED EMBODIMENT(S)

The conductive adhesives of this invention have one or more of the following distinguishing properties:
1. Low tensile modulus, in the range 5000–450,000 psi, at room temperature.
2. Low resistivity especially with the preferred Ag/Pd and Ag/Au filler system.
3. Excellent adhesion to ceramic, Pb/Sn solder, and plated Au.
4. Adhesion durability under thermal shock and temperature-humidity stress exposure.

5. TCR stability (thermal coefficient of resistance).
6. Resistance to stress cracking.
7. Interconnection integrity during reliability stress testing.

According to this invention, the improved epoxy-siloxane based conductive adhesive composition is a dispersion of a conductive metal filler in an organic binder system comprising of a liquid epoxy siloxane, a polymer such as an alkyl acrylate or methacrylate polymer additive, an anhydride curing agent, and a commonly used epoxide-anhydride cure catalyst such as a tertiary amine with a proton source. The liquid epoxy siloxane selected is such that it forms a soluble admixture with all other solid or liquid constituents of the binder system forming a clear homogeneous solution which is used for dispersing a conductive metal filler to form the conductive adhesive compositions.

The general term "diepoxide", "polyepoxide", "epoxide" or "epoxy resin" is generally interchangeable and defined as any molecule containing more than one alpha-oxirane group capable of being polymerized by ring-opening reactions of the epoxy group. Exemplary widely used epoxy resins include the diglycidyl ethers of bisphenol A and bisphenol F which are made by reacting epichlorohydrin with bisphenol A or bisphenol F in the presence of a basic catalyst. In the preferred siloxane containing diglycidyl ether epoxides used in the invention, the bisphenol A or bisphenol F group is essentially replaced by the siloxane group. Typical siloxane epoxides useful for the purpose of this invention include commercially available bis(1,3-glycidoxy propyl) tetramethyl disiloxane; bis-(1,5 glycidoxy propyl) hexamethyl trisiloxane and related materials some of which are commercially available. These can be used as the pure epoxy component or in combination with non-siloxane epoxides, for example, 1,4-cyclohexane-dimethanol diglycidyl ether; cycloaliphatic epoxides such as 3,4-cyclohexylmethyl-3,4-epoxycyclohexane carboxylate, or the commonly used diglycidyl ethers of bisphenol A or bisphenol F. Other representative siloxane containing epoxy resins and their method of preparation are shown in U.S. Pat. No. 4,480,009 to Berger and in the article entitled *"Polymers From Siloxane-Containing Epoxies"* by William J. Patterson and Norman Bilow, Journal of Polymer Science: Part A-1, Vol. 7, Pages 1089–1110 (1969), both references being incorporated herein by reference.

Preferred siloxane containing epoxides include: bis(1,3-glycidoxypropyl) tetraalkyl disiloxane; bis-(1,3-glycidoxybutyl) tetralkyl disiloxane; bis(glycidoxy-propyl or glycidoxy-butyl) hexaalkyl trisiloxane; bis(1-3-glycidoxypropyl)bis(methyl 3,3,3-trifluoropropyl) disiloxane; bis(1,5-glycidoxypropyl) tris(methyl 3,3,3-trifluoropropyl) trisiloxane, and related materials, which are represented by the general formula:

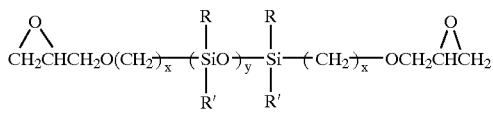

wherein x=2–4; y=1–5, preferably 1–3; R is an alkyl radical represented by the formula, CnH2n+1 where n=1–4; R' is the same as R or a 3,3,3-trifluoropropyl radical represented by the formula —CH$_2$CH$_2$CF$_3$.

The preferred epoxy siloxane precursors are, for example, bis(1,3-glycidoxypropyl)tetramethyl siloxane; bis(1,5-glycidoxypropyl)hexamethyl trisiloxane; bis(1,3-glycidoxypropyl)bis(methyl 3,3,3-trifluoropropyl) disiloxane; bis(1,5-glycidoxypropyl)tris(methyl 3,3,3-trifluoropropyl)trisiloxane, and related materials.

The curing agents for the epoxy siloxane precursors may be any of the known curing agents with the proviso that the curing agent be soluble in the epoxide. The curing agent will be typically selected from the group consisting of amines or anhydrides as conventionally used.

In one embodiment of this invention, the preferred anhydride curing agent is a five-membered anhydride which can be liquid or solid so long as it dissolves in the selected liquid epoxy siloxane by mixing at ambient temperature or by heating to an elevated temperature such as up to 50–70°C.

These include bis-1,2-cyclohexane dicarboxylic anhydride, also named hexahydrophthalic anhydride (HHPA); 4-methyl-1,2-cyclohexane dicarboxylic anhydride, also named hexahydro-4-methylphthalic anhydride (MeHHPA); cis-4-cyclohexene-1,2-dicarboxylic anhydride or cis-1,2,3,6-tetrahydrophthaic anhydride (cis-THPA); methyl-5-norbomene-2,3-dicarboxylic anhydride; and maleic anhydride. These can be used as a single curing agent or as binary or ternary mixtures in the liquid epoxy siloxane.

Other anhydride curing agents include succinic anhydride (SA), dodecenyl succinic anhydride (DDSA), octenyl succinic anhydride; 2-dodecene 1-yl-succinic anhydride; hexadecenyl succinic anhydride. These can be used as a single curing agent or as binary or ternary mixture in the liquid epoxy siloxane.

In general, the amount of epoxide and curing additives are present in substantially equimolar amount, but the epoxide-:curing additive molar ratio may vary from about 3:1 to 1:3, e.g., about 2:1 to 1:1.8 although lower or higher ratios may be employed depending on the reactants and properties desired.

The curing catalyst may be any of the epoxide curing catalysts known in the art and will generally be a tertiary amine in conjunction with a proton source such as nonylphenol, ethylene glycol or propylene glycol for anhydride curing epoxy formulations.

Preferred catalyst according to this invention comprise a tertiary amine with a proton source as the 2,4,6-tris-(dimethylaminomethyl phenol) (DMP) and nonylphenol combination although other standard epoxy curing catalysts can also be employed in the adhesive formulations of these formulations. Exemplary amine catalysts include benzyl dimethylamine; tris-dimethylamino methyl phenol; N,N-dimethyl ethanol amine; N,N,N$^1$N$^1$-tetrakis(2-hydroxypropyl) ethylene diamine and the like, which can be used in conjunction with a proton source such as nonylphenol, ethylene glycol, and mixture thereof.

The preferred polymeric or oligomeric additives are acrylate derived polymers. The acrylate polymer additive used in these adhesive formulations include polyacrylates and polymethacrylates and polyalkyl acrylates and polyalkyl methacrylates such as poly(n-butylacrylate and/or n-butylmethacrylate), poly(n-fluorobutyl methacrylate), and polymethyl methacrylate and mixture thereof. In general, the alkyl group may be about C1–C8, preferably C2–C4. The acrylate polymer is miscible in the adhesive binder formulation.

The polymer additives are preferably selected from the group consisting of poly(methylmethacrylate) having molecular weight in the range about 10,000 to about 75,000, preferably between 15,000 to about 40,000; poly(n-butylmethacrylate), poly(n-fluorobutylmethacrylate) having molecular weight in the range about 40,000 to about 320,000, preferably from about 50,000 to about 200,000; and related polymers so long as these form a miscible blend with the epoxy siloxane-anhydride curing agent system.

The conductive metal filler used in the adhesive compositions described in this invention can be silver (Ag), gold (Au), silver coated with palladium (Ag/Pd), silver coated with gold (Ag/Au), and mixtures thereof. The fillers which are in the form of flake or powder, and the Ag/Pd and the Ag/Au are either surface coated Pd or Au coated Ag, or these can be blends of Ag and Pd or Au in the form of flake or powder such that the Pd or Au are present in an amount in the range of about 5 to 20 wt. % relative to Ag. The particle size of the metal filler varies in the range 2–30 $\mu$m or higher. These compositions are available from Degussa Corporation.

A preferred electrically conductive filler is Pd or Au surface coated Ag flake or powder or a blend of Pd and Ag or Au and Ag, having less than about 10 micron average particle size, although up to about 30 microns or higher may be used. Filler amounts up to about 90% or higher by weight of the total formulation may be employed with preferred amounts of 70% to 85% being typically employed. The fillers may be blended into the formulation using conventional techniques known for obtaining polymer/filler dispersions such as high shear mixers or rotary mixers.

These adhesives can be used for attaching electronic components to PCBs, to attach solder balls on contact pads of a substrate, to attach silicon chips to a substrate, and to attach a chip carrier to a PCB. A typical bonding process using the adhesives of this invention is exemplified by attachment of a ceramic chip carrier to a PCB board typically, epoxy-glass FR-4, according to which the conductive adhesive is screened onto the Au surface contact pads on a ceramic ball grid array (BGA) module which is then positioned onto the PCB such that the adhesive regions on the chip carrier are brought into contact with the contact solder pads, which are preferably Au coated solder contact pad on the printed circuit board. Alternatively, in addition to screen printing the conductive adhesive onto the contact pads of the chip carrier it can also be deposited onto the Au coated solder contact pads on the PCB by screen printing or by the syringe dispense technique, bringing in contact and to aligning the chip carrier and PCB contact pads, and heating the resulting assembly up to 160–170° C. under N2 for example in order to cure the adhesive as described above. Effect of stress exposures on the structure integrity is evaluated by subjecting the assembly to 0° C. to 100° C. thermal shock and 85° C./85% RH temperature-humidity excursions.

EXAMPLES
Preparation of the conductive adhesive paste—General Procedure

The precursor materials including the siloxane epoxide, anhydride curing agent, preformed polymer additive, and curing catalyst/cure accelerator system are commercially available.

General Method of Making the Conductive Adhesive Paste

The liquid siloxane epoxide precursor, e.g., 1,3-bis (glycidoxypropyl)tetramethyl disiloxane, and the anhydride curing agent which may be liquid or low melting solid, are mixed together and the mixture is stirred at about 50–70° C. for 30 min. to completely dissolve the anhydride in the siloxane epoxide. The polymer additive, e.g., poly(n-butyl methacrylate) having molecular weight in the range 40,000 to 320,000 or poly(methacrylate) having molecular weight in the range 10,000 to about 50,000, or mixture thereof, is then added to the epoxide-anhydride solution in an amount such that it is present in an amount 5 to 20 wt % based on the total organic binder which includes siloxane epoxide, anhydride curing agent, polymer additive, and the cure catalyst, and the mixture is stirred for several hours at 50–70° C. until the polymer essentially completely dissolves and a homogeneous clear viscous solution is formed. This mixture is then allowed to cool to room temperature and the cure catalyst system is added which are those commonly used in an epoxy-anhydride cure and which includes a tertiary amine, typically, 2,4,6-tris(dimethylaminomethyl) phenol, benzyldimethyl amine (BDMA), and a proton source as nonylphenol, ethylene glycol, and mixture thereof, and related materials. All the organic components are thoroughly mixed together and the catalyzed system can either be used immediately for dispersing the metal filler to form the conductive paste or it can be, for example, stored at −20 or −40° C. or lower for later use.

To form a conductive adhesive, metal filler is added in portions to the above catalyzed organic binder composition with constant mixing with a rotary mixer. The amount of metal filler added varies between 70–85 wt. %, preferably between 75–85% by weight of the total composition weight depending on the filler type, to obtain a paste viscosity such that it is suitable for screen printing and for syringe dispensing onto a substrate. The stirring rate is maintained for steady mixing without causing excessive entrapment of air bubbles. After a homogeneous paste consistency is obtained for a desired application, the paste is deaerated to remove any trapped air and preferably stored at a minimum of −40° C. when not in use.

Curing and Characterization of the Conductive Adhesives

To thermally cure and characterize the metal filled adhesives described above or their adhesion to various surfaces, the conductive adhesive paste is applied as a thin layer onto a substrate, for example, ceramic, silicon, Au surface, and Pb/Sn solder. No special conditions are required for thermal curing of the adhesive which curing is accomplished by subjecting the adhesive paste 100–120° C. for about 30 min. followed by 160–170° C. for 60 min. in an oven under $N_2$ atmosphere. After the cure cycle is complete, heat is turned off and the cured adhesive samples are allowed to cool to room temperature before removing from the oven, and measuring cured adhesive properties.

Room temperature bulk resistivity of the cured adhesives was measured using the 3 inch by $1/8^{th}$ inch by $1/8^{th}$ inch resistivity bar method. Tensile modulus measurements of the cured adhesive samples having specific dimension were made according to standard technique for tensile testing free standing films. To obtain free standing films for measurement of elastic modulus and resistivity, the conductive formulations are cured in a mold made of a material having low energy surface, the mold having known depth, width and length is typically made of teflon, by dispensing the adhesive paste into the mold and curing at 100–110° C. for about 30 min. followed by 160–170° C. for about 60 min. After cooling to room temperature, the cured samples are removed from the mold and characterized for elastic modulus according to the standard methods using instron tensile test and resistivity measurement using a 3 inch resistivity bar configuration, respectively. Bulk resistance of the cured adhesives was also measured by forming a layer of adhesive with specific dimension on a glass plate, for example, about 5 mil thick, about 3 inches long, and ½ inch wide layer, curing the adhesive under the conditions described above, and measuring the bulk resistance with a four point probe. Resistivity (ohm-cm) is calculated from the bulk resistance (R) and the specimen dimensions using standard methods. Adhesion of the cured adhesives to ceramic and Au surfaces is measured by depositing about 5 mil layer of the adhesive paste on the substrate surface, placing ¼ inch brass studs over the adhesive with light pressure and curing up to about 160–170° C. as described above. After allowing the substrate/adhesive/stud assembly to cool to room temperature, tensile test according to the stud pull method provided the adhesion strength of the various adhesives to ceramic, Au, and Au coated Pb/Sn solder. In addition, shear strength was determined according to the ball shear test for which the conductive adhesive is screened onto a Au surface substrate and Au coated Pb/Sn solder balls are lightly pressed onto the screened adhesive pads and the assembly is cured up to 160–170° C. under N2 as described above. After allowing the assembly to cool to room temperature, ball shear strength is measured by the standard shear tester method. To test the adhesive performance in applications involving ceramic chip carrier to a PCB typically, epoxyglass FR-4, the conductive adhesive is screened onto the Au surface contact pads on a ball grid array module which is then positioned onto the PCB contact pads such that the adhesive pads on the chip carrier are brought into contact with the solder pads, preferably Au coated solder contact pads on the printed circuit board. Alternatively, in addition to screening the conductive adhesive on the chip carrier contact pads, it can also be screened onto the Au coated solder contact pads on the PCB prior to aligning the chip carrier and PCB contact pads, and curing the assembly up to 160–170° C. under N2 as described above. Effect of stress exposures on the structure integrity is evaluated by subjecting the assembly to 0° to 100° C. thermal shock and 85° C./85% RH temperature-humidity excursions.

Thermal stability of the cured adhesives was determined by Thermogravimetric Analysis (TGA) in helium atmosphere by heating the cured samples in the TGA cell from room temperature to 250° C. and monitoring the weight loss as a function of temperature.
Preparation of the Adhesive Compositions in Table 1

Example 1

A soluble mixture of 3.2 g of a 1,3-bis(glycidoxypropyl) tetramethyl disiloxane, 2.03 g hexahydrophthalic anhydride (HHPA), and 0.4 g poly(n-butylmethacrylate) was prepared according to the general procedure described above. To this mixture was added 0.14 g nonylphenol+0.05 g ethylene glycol, and 0.12 g of the tertiary amine 2,4,6-tris (dimethylaminomethyl)phenol(DMP-30) and thoroughly mixed to form a clear homogeneous solution. About 23.8 g of silver flake were blended in this catalyzed mixture to form screenable conductive adhesive paste having about 80.5% Ag filler. Elastic modulus and resistivity data are given in Table 1. Measurements of shear strength with a 20 mil Au coated solder ball on a 2 mil thick adhesive showed adhesion values in 170–240 g range.

Example 2

To about 5.9 g of a catalyzed organic binder mixture of the same composition as described in preceeding Example 1, was blended in 27.9 g Au coated Ag (10% Au/90% Ag) to form conductive paste having 82.5% Ag/Au as the filler. Elastic modulus and resistivity data are given in Table 1. The ball shear strength measurements in comparison to the Ag filled adhesive showed adhesive values in the range 200–290 g.

Example 3

A soluble mixture of 3.1 g of a 1,3-bis(glycidoxypropyl) tetramethyl disiloxane, 1.5 g hexahydrophthalic anhydride (HHPA), and 0.62 g of poly(n-butylmethacrylate) prepared according to the method of Example 1 was catalyzed by the addition of 0.12 g nonylphenol+0.06 g ethylene glycol, and 0.11 g of 2,4,6-tris(dimethylaminomethyl)phenol(DMP-30) and thoroughly mixed to form a clear homogeneous solution. About 18.1 g of Ag/Pd filler (90% Ag/10% Pd wt % ratio) was blended in this catalyzed mixture according to the general method described above to form a conductive adhesive paste having about 77.7 wt. % Ag/Pd filler. Elastic modulus and resistivity data are given in Table 1. Measurements of shear strength with a 20 mil Au coated solder ball on a 2 mil thick adhesive fillet showed adhesion values in 100–140 g range for the ball shear and 125–189 g for the fillet.

Example 4

Dodecenylsuccinic anhydride (DDSA), 2.6 g was added to a solution of about 2.8 g of 1,3-bis(glycidoxy-propyl) tetramethyldisiloxane and 0.6 g of poly(n-butyl methacrylate) prepared by dissolving the polymer in the liquid siloxane epoxide, and heated at 50° C. with stirring until a clear viscous solution was formed. The solution was allowed to cool to room temperature and then 0.04 g of benzyldimethyl amine (BDMA), 0.04 g ethylene glycol and 0.03 g nonylphenol were added and well mixed to form a clear homogeneous solution. About 27 g of silver flake as metal filler was blended in the catalyzed mixture according to the general method described above to form a conductive adhesive paste having about 81.8% (wt %) filler loading. Measurement of resistivity of the cured adhesive gave a value of 0.02 ohm-cm as given in Table 1.

Example 5

Dodecenylsuccinic anhydride (DDSA), 2.6 g was added to a solution of about 2.8 g of 1,3-bis(glycidoxypropyl) tetramethyldisiloxane and 0.6 g of poly(n-butyl methacrylate) prepared by dissolving the polymer in the liquid siloxane epoxide, and heated at 50° C. with stirring until a clear viscous solution was formed. The solution was allowed to cool to room temperature and then 0.035 g of nonylphenol, 0.025 g of ethylene glycol and 0.06 g 2,4,6-tris(dimethylaminomethyl)phenol(DMP-30) were added and well mixed to form a clear homogeneous solution. To about 5.5 g of the final catalyzed mixture was blended in a mixed metal filler comprising 17.2 Ag/Pd (90% Ag/10% Pd, wt %) and 4.5 g silver flake according to the method described in the above examples to form a conductive adhesive paste having about 79.8% (wt %) filler loading. Measurement of resistivity gave a value of 0.0006 ohm-cm and room temperature elastic modulus about 13,000 psi (Table 1). Adhesion to Au measured by the ball shear test gave a value of about 112 g.

Example 6

A soluble mixture of 3.1 g of 1,3-bis(glycidoxypropyl) tetramethyl disiloxane, 1.5 g hexahydrophthalic anhydride (HHPA), and 0.66 g of poly(n-butylmethacrylate) prepared as described in Example 3, was catalyzed by the addition of 0.15 g nonylphenol and 0.12 g of 2,4,6-tris (dimethylaminomethyl)phenol(DMP-30) and thoroughly mixed to form a clear homogeneous solution. About 21 g of Ag/Pd filler (90% Ag/10% Pd wt % ratio) was blended in this catalyzed mixture according to the general method described above to form a conductive adhesive paste having about 79.2 wt % Ag/Pd filler. Measurement of resistivity of the cured adhesive gave value of 0.0017 ohm-cm and room temperature elastic modulus about 8,000 psi (Table 1).

Example 7

A mixture of 3.57 g of a 1,3-bis(glycidoxypropyl) tetramethyl disiloxane and 0.73 g of poly(n-butyl-methacrylate) was heated with stirring until a clear solution was formed and then 2.1 g 4-methyl hexahydrophthalic anhydride was added and the mixture allowed to stir for about 30 min. and a clear viscous solution formed. To about 3.2 g of the mixture was added 0.04 g nonylphenol, 0.04 g ethylene glycol and 0.07 g DMP-30 and the contents thoroughly mixed until it formed a clear homogeneous solution. About 12 g of Ag/Pd filler (90% Ag/10% Pd wt % ratio) was blended in this catalyzed mixture according to the general method described above to form a conductive adhesive paste having about 79.2% Ag/Pd filler. Measurement of resistivity of the cured adhesive gave a value of 0.001 ohm-cm and room temperature elastic modulus about 24,000 psi (Table 1).

Example 8

To about 3.0 g of the remaining uncatalyzed mixture from Example 6 was added 0.05 g nonylphenol, 0.02 g ethylene glycol and 0.066 DMP30 and the contents thoroughly mixed until it formed a clear homogeneous solution. About 16.2 g of Ag/Au filler (90% Ag/10% Pd wt % ratio) was then blended in according to the general method described above to form a conductive adhesive

Example 9

A mixture of 4.6 g of a 1,3-bis(glycidoxypropyl) tetramethyl disiloxane and 1.22 g of poly (methylmethacrylate), molecular weight 15,000, was heated with stirring until a clear solution was formed and then 2.3 g hexahydrophthalic anhydride (HHPA) was added and the mixture allowed to stir for about 30 min. and a clear viscous solution formed. To this mixture was added 0.05 g nonylphenol, 0.04 g ethylene glycol and 0.08 g DMP-30 and the contents thoroughly mixed until it formed a clear homogeneous mixture. About 29.5 g of Ag/Pd filler (90% Ag/10% Pd wt % ratio) was blended in this catalyzed mixture according to the general method described above to form a conductive adhesive paste having about 78.6% Ag/Pd filler. Measurement of resistivity of the cured adhesive gave a value of 0.0009 ohm-cm and room temperature elastic modulus about 8,200 psi (Table 1).

TABLE 1

ANHYDRIDE CURED SILOXANE EPOXIDE BASED CONDUCTIVE ADHESIVES

| Example | Anhydride Curing Agent[a] | Epoxide[b]/ Anhydride wt. ratio | nBuMA poly. additive[c], wt % in total binder | Conductive Metal Filler | Resistivity (ohm-cm) | Tensile Modulus (psi) @ RT |
|---|---|---|---|---|---|---|
| 1 | HHPA | 1.5:1 | 7.5 | Silver Flake | $4 \cdot 10^{-2}$ | 19,000 |
| 2 | HHPA | 1.5:1 | 7.5 | Ag/Au | $1 \cdot 10^{-3}$ | 36,000 |
| 3 | HHPA | 2.0:1 | 11 | Ag/Pd | $1 \cdot 10^{-3}$ | 15,000 |
| 4 | DDSA | 1.07:1 | 10 | Silver Flake | $2 \cdot 10^{-2}$ |  |
| 5 | DDSA | 1.07:1 | 10 | Ag/Pd + 10% Silver Flake | $6 \cdot 10^{-4}$ | 13,000 |
| 6 | HHPA | 2.1:1 | 12.5 | Ag/Pd | $1.7\ 10^{-3}$ | 8,000 |
| 7 | MeHHPA | 1.7:1 | 11.4 | Ag/Pd | $1 \cdot 10^{-3}$ | 24,000 |
| 8 | MeHHPA | 1.7:1 | 11.4 | Ag/Au | $1 \cdot 10^{-3}$ | 20,000 |
| 9 | HHPA | 2:1 | 15.2 PMMA avg Mw. 15K | Ag/Pd | $9 \cdot 10^{-4}$ | 8,200 |

[a]HHPA = Hexahydrophthalic anhydride, DDSA = Dodecenyl Succinic anhydride; MeHHPA = 4-Methyl Hexahydrophthalic anhydride.
[b]Epoxide = 1,3-bis(glycidoxypropyl)tetramethyldisiloxane.
[c]nBuMA poly. = Poly(n-butyl methacrylate), intrinsic viscosity about 0.5, avg Mw, 320K; PMMA = Poly(methyl methacrylate), avg Mw 15,000

The results of Table I show:

The conductive adhesives formulated with the use of Ag/Au or Ag/Pd conductive metal filler have higher conductivity than the silver filled adhesives using the same binder system. For example, the measured resistivity for the silver flake adhesive of example 1 is 0.04 ohm-cm while the Ag/Au filled adhesive of example 2 shows a resistivity value of 0.001 ohm-cm which is more than an order of magnitude lower. Similarly, comparison of resistivity value for the silver filled adhesive of example 4 and that of the essentially Ag/Pd filled (with only 10% Ag flake added) adhesive of example 5 shows 0.02 ohm-cm and 0.0006 ohm-cm, respectively, again the Ag filled adhesive having more than an order of magnitude lower conductivity than the corresponding Ag/Pd filled adhesive. This trend is maintained in all the representative adhesives shown.

The tensile modulus data for measurements at room temperature shows that the values ranging from 8,000 psi to 36,000 psi are obtained depending on the anhydride curing agent used, epoxide/anhydride wt. ratio, type of conductive filler, the chemistry and the relative amount of the polymer additive, i.e., poly(n-butylmethacrylate) vs poly (methymethacrylate) and the molecular weight of these additives. For example, the examples 6 and 9 show with the same epoxide to anhydride ratio (2:1) and the same filler (Ag/Pd), and poly(n-butylmethacrylate) having high molecular weight, added at 12.5% in example 6 while the low molecular weight PMMA at 15.2% have similar elastic modulus value of about 8,000 psi. In general, these data show that adhesives having high conductivity, and low to medium elastic modulus can be obtained by adjusting the ratio of the various ingredients in the conductive adhesive compositions according to this invention.

Thermal stability of the cured adhesives as determined by Thermogravimetric Analysis (TGA) show that there is less than 0.5% weight loss during dynamic TGA up to 250° C. and less than about 0.2% loss during isothermal run at 220–230° C. for 30–60 min. following the dynamic run.

Adhesion tests with these adhesives according to the stud pull method showed generally very high bond strength with ceramic and Au surfaces which actually increases somewhat upon thermal cycling and does not undergo any significant degradation upon temperature-humidity exposure up to 1000 hrs. For stable adhesion of these adhesives to Pb/Sn solder balls, it is found necessary to form a thin Au layer on Pb/Sn solder ball surface.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention. Thus, having described the invention,

What is claimed is:

1. A curable epoxy-siloxane based solvent-free conductive adhesive resin composition comprising:
   a siloxane comprising at least two epoxy-functional groups, or mixtures thereof;
   a curing agent;
   a curing catalyst;
   an organic polymeric or oligomeric additive; and
   a conductive filler selected form the group consisting of Ag coated with palladium, Ag coated with Au, and mixtures thereof;
   wherein the siloxane, the curing agent, curing catalyst, and polymer additive are mutually soluble.

2. The composition of claim 1, wherein the siloxane is represented by the formula:

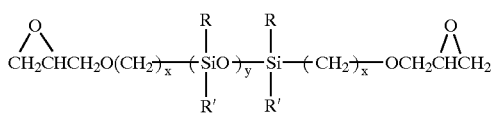

wherein x=2–4; y=1–5; R is an alkyl radical represented by the formula $C_nH_{2n+1}$, where n=1–4; R' is the same as R or a 3,3,3-trifluoropropyl radical represented by the formula—$CH_2CH_2CF_3$.

3. The composition of claim 2 wherein the curing agent is an anhydride.

4. The composition of claim 3, wherein the polymeric or oligomeric additive is selected from the group consisting of:
   polyacrylate, polymethacrylate, polyalkylacrylate, polyalkylmethacrylate, and perfluoro alkyl acrylate;
   wherein the alkyl group in said polyalkylacrylate, polyalkylmethacrylate, or perfluoro alkyl acrylate has 1 to 8 carbon atoms.

5. The composition of claim 4 wherein the siloxane is selected from the group consisting of bis(1,3-glycidoxy propyl) tetramethyl disiloxane and bis(1,5-glycidoxy propyl) hexamethyl trisiloxane and mixtures thereof.

6. The composition of claim 5 wherein the curing agent is selected from the group consisting of hexahydrophthalic anhydride and 4-methylhexahydrophthalic anhydride, and mixtures thereof.

7. The composition of claim 5 wherein the curing agent is selected from the group consisting of dodecenyl succinic anhydride, maleic anhydride, methyl nadic anhydride, and mixture thereof.

8. An electronic component article of manufacture comprising:
   a substrate having disposed thereon a cured conductive adhesive composition; and
   an object bonded to said substrate using said adhesive;
   wherein said adhesive composition is the adhesive composition according to claim 1.

9. The electronic component article of manufacture of claim 8, wherein said object is a semiconductor chip carrier.

10. The electronic component article of manufacture of claim 8, wherein said object is an electronic component, and said substrate is a circuit board.

11. The electronic component article of manufacture of claim 8, wherein the siloxane of said adhesive composition is represented by the formula:

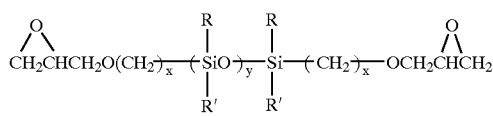

wherein x=2–4; y=1–5; R is an alkyl radical represented by the formula $C_nH_{2n+1}$, where n=1–4 ; R' is the same as R or a 3,3,3-trifluoropropyl radical represented by the formula—$CH_2CH_2CF_3$.

12. The electronic component article of manufacture of claim 8, wherein: the siloxane of said adhesive composition is represented by the formula:

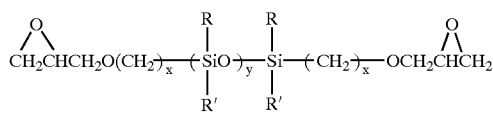

wherein x=2–4; y=1–5; R is an alkyl radical represented by the formula $C_nH_{2n+1}$, where n=1–4; R' is the same as R or a 3,3,3-trifluoropropyl radical represented by the formula —$CH_2CH_2CF_3$; the curing agent of said adhesive composition is an anhydride; and the polymeric or oligomeric additive of said adhesive composition is selected from the group consisting of:
   polyacrylate, polymethacrylate, polyalkylacrylate, polyalkylmethacrylate, perfluoro alkyl acrylate,
   wherein the alkyl group in said polyalkylacrylate, polyalkylmethacrylate, or perfluoro alkyl acrylate has 1 to 8 carbon atoms.

13. A method for making an electronic component assembly which requires attachment of separate components comprising the steps of:
   applying the conductive adhesive of claim 1 onto one of the components to be bonded;
   placing the other component to be bonded on the adhesive of the adhesive coated component; and
   curing the adhesive to attach the components.

14. The method of claim 13, wherein the siloxane of said adhesive is represented by the formula:

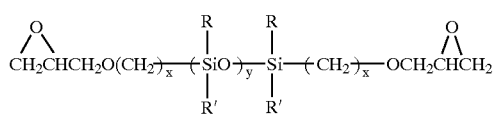

wherein x=2–4; y=1–5; R is an alkyl radical represented by the formula $C_nH_{2n+1}$, where n=1–4; R' is the same as R or a 3,3,3-trifluoropropyl radical represented by the formula—$CH_2CH_2CF_3$.

15. The method of claim 13 wherein: the siloxane of said adhesive is represented by the formula:

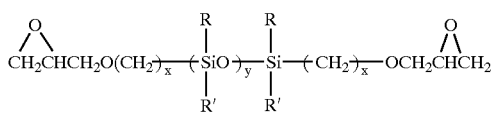

wherein x=2–4; y=1–5; R is an alkyl radical represented by the formula $C_nH_{2n+1}$, where n=1–4; R' is the same as R or a 3,3,3-trifluoropropyl radical represented by the formula—$CH_2CH_2CF_3$; the curing agent of said adhesive is an anhydride; and the polymeric or oligomeric additive of said adhesive is selected from the group consisting of:

polyacrylate, polymethacrylate, polyalkylacrylate, polyalkylmethacrylate, perfluoro alkyl acrylate, wherein the alkyl group in said polyalkylacrylate, polyalkylmethacrylate, or perfluoro alkyl acrylate has 1 to 8 carbon atoms.

* * * * *